United States Patent
Moidu et al.

(10) Patent No.: US 9,563,021 B2
(45) Date of Patent: Feb. 7, 2017

(54) OPTICAL SWITCHING DEVICE

(71) Applicant: Lumentum Operations LLC, Milpitas, CA (US)

(72) Inventors: Abdul Jaleel K. Moidu, Nepean (CA); Sheldon McLaughlin, Ottawa (CA); Nenad Duricic, Ottawa (CA)

(73) Assignee: Lumentum Operations LLC, Milpitas, CA (US)

(*) Notice: Subject to any disclaimer, the term of this patent is extended or adjusted under 35 U.S.C. 154(b) by 0 days.

(21) Appl. No.: 14/660,367

(22) Filed: Mar. 17, 2015

(65) Prior Publication Data

US 2015/0260921 A1  Sep. 17, 2015

Related U.S. Application Data

(60) Provisional application No. 61/953,977, filed on Mar. 17, 2014.

(51) Int. Cl.
*G02B 6/35* (2006.01)

(52) U.S. Cl.
CPC ............ *G02B 6/3582* (2013.01); *G02B 6/359* (2013.01); *G02B 6/3584* (2013.01)

(58) Field of Classification Search
CPC ...... G02B 6/3582; G02B 6/3584; G02B 6/359
See application file for complete search history.

(56) References Cited

U.S. PATENT DOCUMENTS

| | | | |
|---|---|---|---|
| 5,175,611 A | 12/1992 | Richardson et al. | 257/699 |
| 6,374,007 B1 | 4/2002 | Hagelin et al. | 385/17 |
| 6,718,084 B1 | 4/2004 | Wang | 385/17 |
| 6,860,652 B2 | 3/2005 | Narayan et al. | 385/94 |
| 6,905,255 B2 | 6/2005 | Flanders et al. | 385/88 |
| 6,955,483 B2 | 10/2005 | Narayan | 385/94 |
| 6,986,611 B1 * | 1/2006 | Scruggs | G02B 6/4246 385/147 |
| 7,046,411 B1 | 5/2006 | Fleming | 359/224.1 |
| 7,255,494 B2 | 8/2007 | Zheng | 385/92 |
| 7,255,496 B2 | 8/2007 | Narayan et al. | 385/92 |
| 7,329,056 B2 | 2/2008 | Sherrer et al. | 385/93 |
| 7,354,203 B2 * | 4/2008 | Pfnuer | G02B 6/36 385/92 |
| 7,357,580 B2 * | 4/2008 | Morgenstern | G02B 6/3825 385/55 |
| 7,402,878 B2 | 7/2008 | Tarn | 257/414 |
| 8,036,502 B2 * | 10/2011 | Duricic | G02B 6/3512 385/14 |
| 8,121,483 B2 * | 2/2012 | Duricic | G02B 6/2931 398/164 |

(Continued)

*Primary Examiner* — Peter Radkowski
(74) *Attorney, Agent, or Firm* — Harrity & Harrity, LLP

(57) ABSTRACT

An optical switching device including an optical switching engine may be packaged by omitting an optical bench and disposing optical elements directly on a base of a housing of the optical switching device. The optical switching engine may be disposed on a ceramic portion of the base, and thermally matched to the ceramic base. The base may be reinforced by the housing walls and optional internal rigidity ribs. The optical elements may be thermally matched to the base, and the lid may be strain relieved by thinning lid edges. The housing may be mounted to an external chassis using soft grommets.

20 Claims, 6 Drawing Sheets

(56) References Cited

U.S. PATENT DOCUMENTS

| | | | | |
|---|---|---|---|---|
| 8,503,884 B2* | 8/2013 | Lee | ..................... | H04B 10/40 |
| | | | | 385/14 |
| 2003/0057508 A1 | 3/2003 | Bendelli et al. | .............. | 257/433 |
| 2004/0151442 A1* | 8/2004 | Scruggs | ............... | G02B 6/4246 |
| | | | | 385/92 |
| 2004/0156581 A1 | 8/2004 | Golub et al. | ..................... | 385/18 |
| 2005/0263878 A1 | 12/2005 | Potter | ........................... | 257/704 |
| 2006/0024004 A1* | 2/2006 | Pfnuer | ................. | G02B 6/4201 |
| | | | | 385/92 |
| 2006/0204180 A1* | 9/2006 | Morgenstern | ........ | G02B 6/3825 |
| | | | | 385/66 |
| 2008/0131130 A1 | 6/2008 | Chang et al. | ................... | 398/83 |
| 2009/0214207 A1* | 8/2009 | Duricic | ................ | G02B 6/2931 |
| | | | | 398/50 |
| 2009/0263080 A1* | 10/2009 | Duricic | ................ | G02B 6/3582 |
| | | | | 385/16 |
| 2010/0086310 A1* | 4/2010 | Lee | ........................ | H04B 10/40 |
| | | | | 398/138 |

* cited by examiner

OPTICAL SWITCHING DEVICE

CROSS-REFERENCE TO RELATED APPLICATIONS

The present invention claims priority from U.S. Provisional Patent Application No. 61/953,977 filed Mar. 17, 2014, which is incorporated herein by reference.

TECHNICAL FIELD

The present disclosure relates to optical devices, and in particular to optomechanical packaging of optical switching devices.

BACKGROUND

Optical devices typically include optical elements held in a pre-determined spatial relationship by mechanical supports and holders. A mechanical package or housing may be provided to protect sensitive optical elements of an optical device from dust, shock, vibration, and other unwanted influences of the outside environment. To prevent external mechanical stresses from shifting optical components out of alignment, a dedicated rigid plate, termed "optical bench", may be suspended inside the housing, and the optical elements may be mounted directly to the optical bench. When the optical bench is rigid enough, the mechanical stresses may be decoupled from the optical elements supported by the optical bench, reducing chances of an optical misalignment.

Telecommunications equipment is frequently held in racks, or crates, having an array of parallel vertical slots for receiving individual telecommunication modules. The slots usually have a fixed width. Accordingly, optical modules used in telecommunication equipment need to be narrower than a multiple of the slot width, and preferably narrower than a single slot width, to fit into their dedicated slots in the racks or crates. The requirement of maximal allowed width, or height if placed horizontally, may provide a restriction of the maximal height of optical devices used in the telecommunication modules. A mere increase of the optical device height by one millimeter may render the optical device unusable, or it may require a stepwise increase of the telecommunication module width by an entire slot width. Many similar modules may be required for a multi-channel optical telecommunications system, further multiplying the required slot space. For this reason, it may be highly desirable to reduce height of individual optical modules.

In view of the foregoing, it may be understood that there may be significant problems and shortcomings associated with current solutions for mounting optical components of optical devices into housings.

SUMMARY

Optical benches for holding optical components may add a significant height to optical devices. It may be preferable to omit optical benches by placing individual optical components directly onto a base of a housing, and to attach a cover enclosing all the optics directly to the base. To reduce the stresses and resulting deformation, one may thermally match the optical components to the base, and strengthen the base by rigidly attaching walls of the cover, and/or dedicated rigidity ribs, to the base. The housing may be then flexibly suspended in an external frame or chassis, thereby reducing mechanical stresses exerted on the housing. By way of a non-limiting example, the housing may be suspended using a set of soft grommets or flexures coupled to the external chassis.

In accordance with one aspect of the disclosure, there is provided an optical switching device comprising at least one input port for inputting an optical signal comprising a plurality of wavelength channels, at least one output port for outputting at least one of the wavelength channels, optics for dispersing and redirecting the wavelength channels between the input and output ports, a switching engine optically coupled with the optics for redirecting at least one of the wavelength channels towards a selected output port, and a housing for enclosing the optics and the switching engine.

The housing may include a base comprising a first portion comprised of ceramic having a coefficient of thermal expansion (CTE) matched to that of the switching engine to within 2 ppm/° C. The switching engine may be mounted directly to the ceramic first portion. The housing may further include a cover enclosing the optics and the switching engine, wherein the cover is mounted directly to the base for stiffening the base. The optics may be CTE matched to the base to within 2 ppm/° C. and mounted directly to the base. The first ceramic portion of the base may include an extension extending beyond the cover and including electrical leads electrically connected to the switching engine and extending beyond the cover. The ceramic may be made of high-temperature co-fired ceramic (HTCC) assembly, which allows such leads to be integrally formed within the ceramic.

The base may include a second portion extending from the first portion, for supporting at least some of the optics. By way of a non-limiting example, the second portion may be comprised of ceramic or metal. The material of the second portion may be CTE matched to the ceramic of the first portion to within approximately 4 ppm/° C. or less. In one embodiment, the housing may include a CTE compensator mounted directly to the second portion and having a CTE different from a CTE of the second portion by at least 1 ppm/° C., for lessening a wavelength drift of the optical switching device with temperature. The cover may include a frame and a lid mounted, e.g. soldered, to the frame along the frame perimeter. In one embodiment, the cover may further include a seal ring mounted directly to the frame and the lid outside of the frame along the perimeter of the lid. The frame may be mounted directly to the base, to stiffen the base, and at the same time to protect the optics and the switching engine.

The housing may be mounted to an external chassis via mounts having elastic modulus of less than 20 MPa, and preferably less than 2 MPa. Depending on the type of the optical switching device, the optics may include a concave mirror, a lens, polarizing and directing optics, and a wavelength dispersing device such as a diffraction grating. The switching engine may include e.g. a liquid crystal in silicon (LCoS) array, a micro-electro-mechanical system (MEMS) array, a diffractive beamsplitter, or another optical element capable of redirecting multiple optical beams impinging thereon.

BRIEF DESCRIPTION OF THE DRAWINGS

Exemplary embodiments will now be described in conjunction with the drawings, in which.

DETAILED DESCRIPTION

Figure 1A:
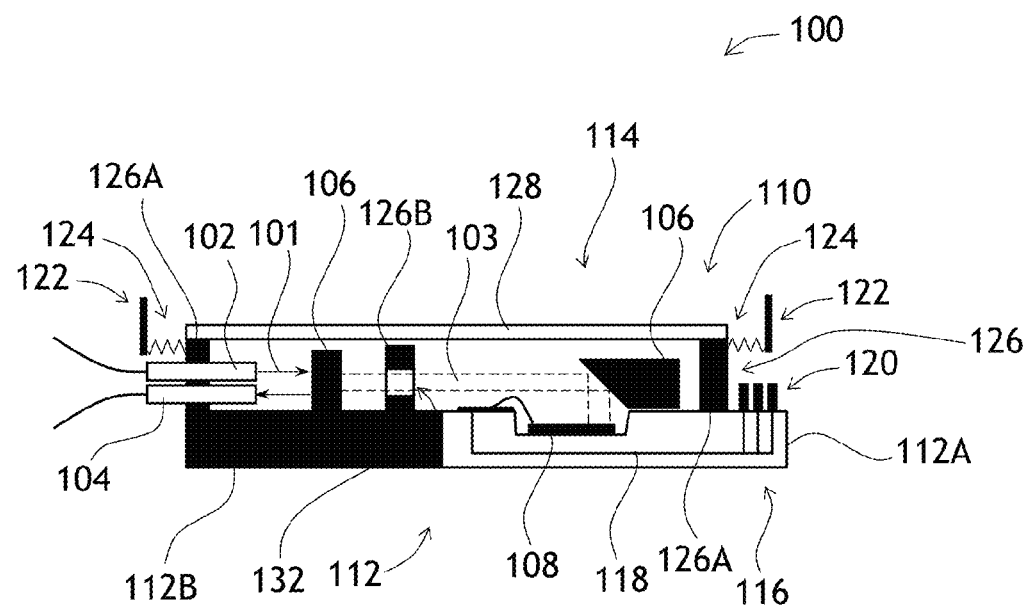
FIG. 1A illustrates a side cross-sectional view of an optical switching device of the present disclosure.

While the present teachings are described in conjunction with various embodiments and examples, it is not intended that the present teachings be limited to such embodiments. On the contrary, the present teachings encompass various alternatives and equivalents, as will be appreciated by those of skill in the art. In FIGS. 1A, 1B, FIG. 2, FIG. 3, and FIGS. 6A-6D, similar reference numerals refer to similar elements.

Figure 1B:
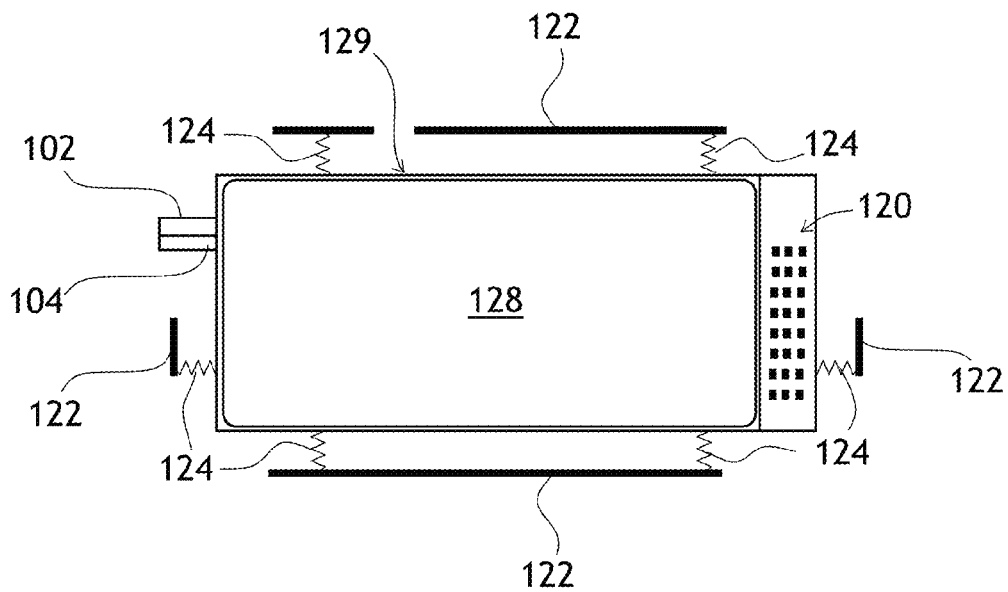
FIG. 1B illustrates a top view of the optical switching device of FIG. 1A.

Referring to FIGS. 1A and 1B, an optical switching device 100 may include at least one input port 102 for inputting an optical signal 101 (FIG. 1A) comprising a plurality of wavelength channels 103. At least one output port 104 may be provided for outputting at least one of the wavelength channels 103. Optics 106 e.g. lenses, mirrors, polarizers, waveplates, etc., may be disposed and configured for dispersing and redirecting the wavelength channels 103 between the input 102 and output 104 ports. A switching engine 108 may be optically coupled with the optics 106 for redirecting at least one of the wavelength channels 103 towards a selected output port e.g. the output port 104 shown in FIG. 1A. By way of an illustrative example and without limitation, the switching engine 108 may include a liquid crystal array, a LCoS array, a MEMS array, a diffractive beamsplitter, etc. The optical switching device 100 may include a multiport optical switch, a wavelength selective optical switch, a multicasting optical switch, etc. Dimensions of the optical switching device 100 may vary. A low height is preferred for reasons stated above, even for a larger footprint devices. For instance, the optical switching device 100 may have a footprint of at least 90 mm×50 mm and a height less than 27 mm, more preferably less than 20 mm or even less than 14 mm.

A housing 110 may be provided for supporting and protecting the optics 106 and the switching engine 108 from dust, humidity, etc. The housing 110 may include a base 112, e.g. a base plate, which may have a first portion 112A and a second portion 112B extending from the first portion 112A. In one embodiment, the first portion 112A is comprised of ceramic. The second portion 112B may be comprised of ceramic or metal, which is CTE matched to the ceramic within 4 ppm/° C., more preferably to within 2 ppm/° C., and most preferably to within 0.5 ppm/° C. The second portion 112B may support at least some of the optics 106. The switching engine 108 may be mounted directly to the ceramic first portion 112A, which may be CTE matched to the switching engine 108, e.g. to within 4 ppm/° C., more preferably to within 2 ppm/° C., and most preferably to within 0.5 ppm/° C. In one embodiment, the first portion 112A is comprised of a low-expansion ceramic e.g. aluminum nitride ceramic, and the second portion 112B is comprised of a low-expansion alloy e.g. Kovar.

The housing 110 may further include a cover 114 enclosing the optics 106 and the switching engine 108. The cover 114 may be mounted directly to the base 112 for stiffening the base 112 and protecting the optics 106 and the switching engine 108. Herein and throughout the rest of the specification, the term "mounted directly" means that the two parts are mounted one to another without any intermediate mechanical parts or components. Suitable attaching or bonding agents, such as solder, epoxy, etc., may be used to mount the two parts directly to each other. Thus, the cover 114, when soldered to the base 112, is still considered to be "mounted directly", even though the cover 114 and the base 112 may be held together by a layer of solder spread in between the cover 114 and the base 112. The optics 106 may be CTE matched to the base 112, e.g. to within 4 ppm/° C., or more preferably to within 2 ppm/° C., and mounted either directly to the base 112, or by using CTE-matched submounts.

Depending on the attachment method employed, the cover 114 may function as a stiffener of the base 112. The stiffening provided by the cover 114 may improve optomechanical stability of the optical switching device 100 upon mounting of the optical device 100 to an external chassis 122 (FIG. 1B). Without the stiffening of the base 112, small misalignments may even occur under the weight of the base 112 and the optics 106. Resistance of the optical switching device 100 to shock and vibration may also be improved by stiffening the base 112. The housing 110, when hermetically sealed, may become susceptible to variations in ambient atmospheric or internal gas pressure, causing a deformation of the base 112 and a resulting misalignment of the optics 106. The stiffening of the base 112 by the cover 114 may also lessen this pressure caused deformation. Hardness of solder used to attach the cover 110 to the base 112 may impact the stiffening effect of the cover 114 on the base 112.

In the embodiment shown in FIG. 1A, the ceramic portion 112A includes an extension 116 extending beyond the cover 114. The extension 116 may include electrical leads 118 electrically connected to the switching engine 108 and extending beyond the cover 114, as shown. The electrical leads 118 may be conveniently provided by using high temperature co-fired ceramic (HTCC), which may include integrated wiring. HTCC is a multilayered, sealed and highly reliable ceramic comprising multiple co-fired layers of ceramic tape including e.g. 92% aluminum oxide ceramic. The co-fired tape layers may incorporate metalized circuit patterns on ceramic players, which form the electrical leads 118. The ceramic tape layers may be laminated under pressure, and the ceramic and metallization may be co-sintered at 1600° C., creating a monolithic structure with the electrical leads 118 locked within the ceramic. The electrical leads 118 may be coupled to an optional connector 120 disposed on the extension 116 of the ceramic portion 112A, as shown in FIG. 1A.

Turning to FIG. 1B with further reference to FIG. 1A, the cover 114 typically includes a frame 126 (FIG. 1A) for mounting directly to the base 112, and a lid 128 having a perimeter 129 (FIG. 1B) and mounted to the frame 126 along the lid perimeter 129 forming a unified structure for stiffening the base 112. The housing 110 of the optical switching device 100 may be mounted to the external chassis 122 (FIG. 1B) via optional mounts 124, e.g. soft grummets or flexures. The mounts 124 may have modulus of elasticity of no greater than 20 MPa, and more preferably no greater than 2 MPa, to relieve the mechanical stresses caused by mounting the optical switching device 100 to the external chassis 122.

In one embodiment, the frame 126 includes an outer section, e.g. outer vertical solid wall, 126A surrounding the optics 106 and the switching engine 108, and an additional inner section, e.g. inner vertical solid wall, rib or pedestal, 126B disposed between the optics 106 and the switching engine 108 and mounted directly to the base 112 for further stiffening the base 112. The inner section 126B is surrounded by the outer section 126A, and may be implemented as a part of the second portion 112B of the base 112. For cases where the second portion 112B is made of metal, the inner portion 126B may be made out of the same metal as the second portion 112B, and may extend from the second portion 112B. The inner section 126B may include at least one opening 132 for propagating at least one of the wavelength channels 103 through the at least one opening 132. The inner section 126B may function as a rigidity rib for additionally strengthening the base 112.

Figure 2:
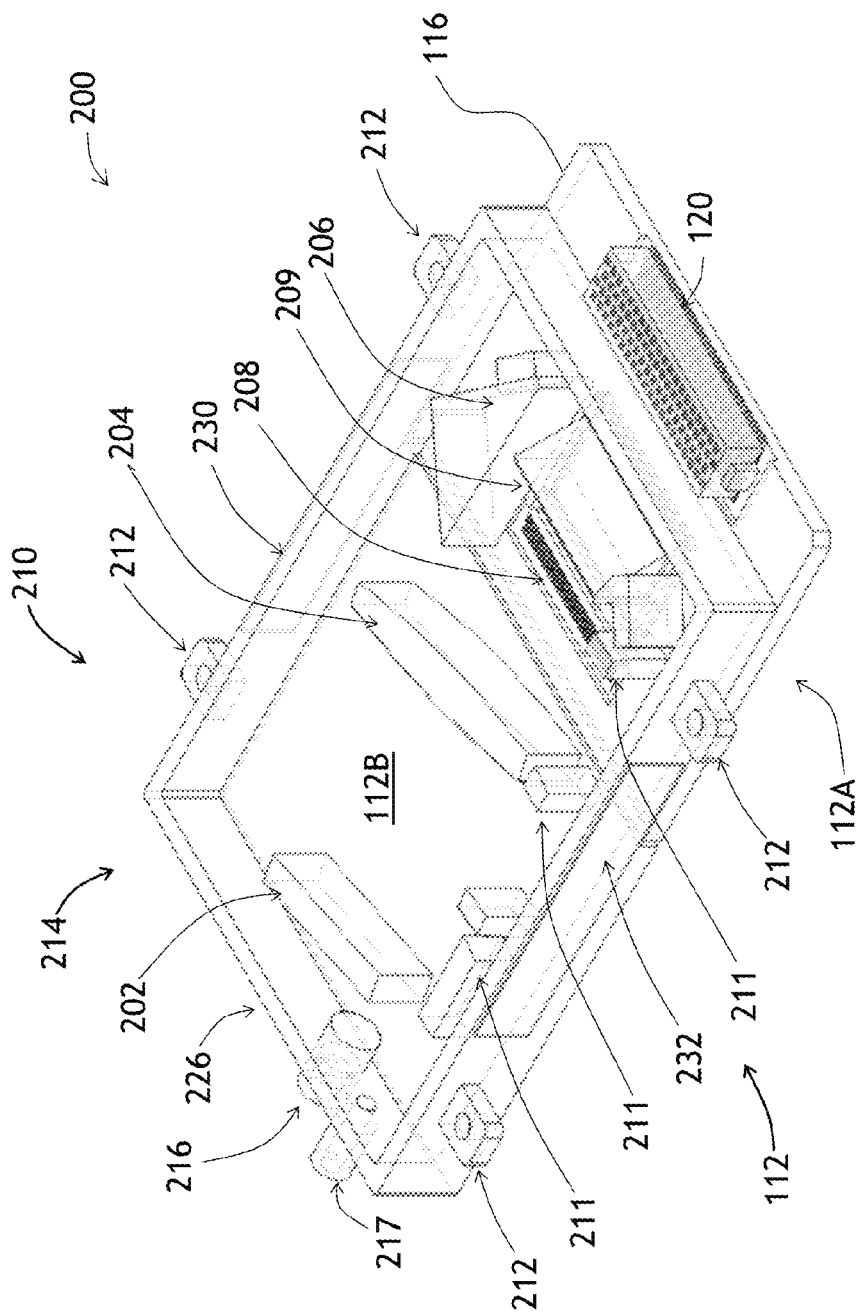
FIG. 2 illustrates a three-dimensional view of a temperature-stabilized, non-hermetic variant of the optical switching device of FIGS. 1A and 1B.

Referring to FIG. 2 with further reference to FIGS. 1A and 1B, an optical switching device 200 of FIG. 2 is similar to the optical switch device 100 of FIGS. 1A and 1B. The optical switch device 200 of FIG. 2 may include a housing 210 having the base 112, which includes the first ceramic portion 112A, to which a switching engine 208 is mounted, the second metal portion 112B, and a cover 214. The cover 214 may include a solid, e.g. vertical wall, frame 226, and a tube 217 for feeding through input and output optical fibers, not shown. Similar to the optical switch device 100 of FIGS. 1A and 1B, the first ceramic portion 112A of the optical switch device 200 of FIG. 2 may include the extension 116 and the connector 120 disposed on the extension 116. Flanges 212 may extend from the frame 214 for mounting to an external frame or chassis, not shown. Optics of the optical switch device 200 may include a diffraction grating 202, a lens 204, a compensating prism 206, a folding prism 209, and polarizing optics 211.

Heaters 232 may be used to maintain the optical switching device 100 at a constant temperature. To lessen pressure induced deformation of the base 112, the cover 214 of the optical switch device 200 may include a vent, or an opening 216 for equalizing outside and inside air pressure. The effect of varying atmospheric pressure on the optical switching device 200 may be lessened by providing a pressure sensor, not shown, and by controlling the optical switching device 200 to compensate for the varying atmospheric pressure. By way of a non-limiting example, when the optical switching engine 208 comprises a LCoS array, effect of varying atmospheric pressure on a wavelength shift of the diffraction grating 202 may be lessened by shifting the addresses of individual pixels of the LCoS array in accordance with the known wavelength-pressure coefficient. Additionally, a moisture sensor may be provided to compensate for a change of refractive index of air with change in ambient humidity.

Figure 3:
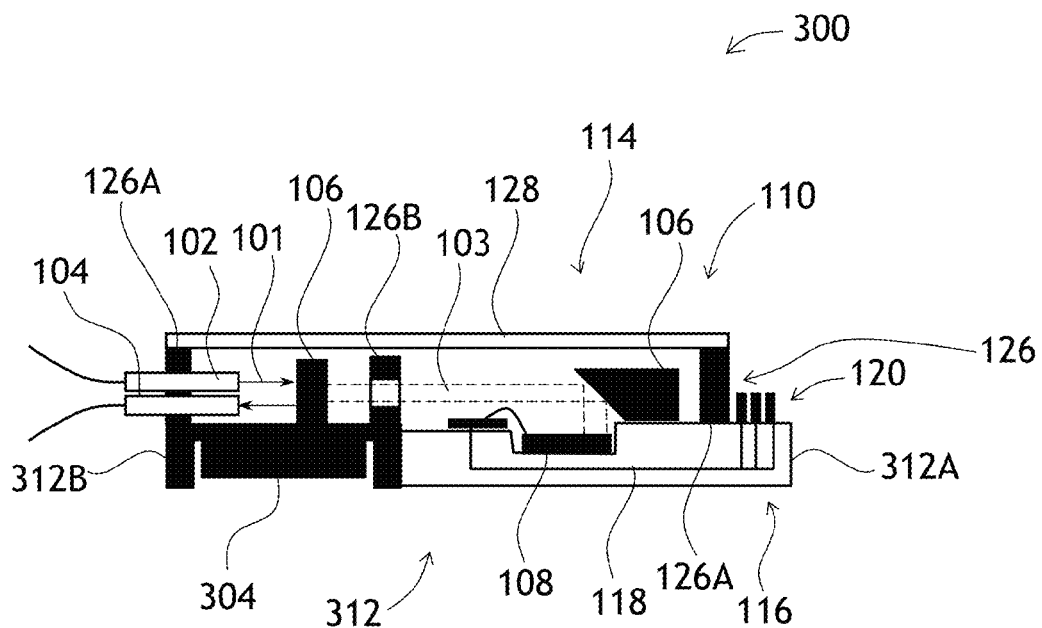
FIG. 3 illustrates a side cross-sectional view of an optical switching device of the present disclosure, including a stiffener rib and a wavelength drift compensator.

Referring now to FIG. 3 with further reference to FIGS. 1A and 1B, an optical switching device 300 of FIG. 3 is similar to the optical switch device 100 of FIGS. 1A and 1B, and includes similar elements. A base 312 of the optical switch device 300 of FIG. 3 may include a first portion 312A and a second portion 312B extending from the first portion 312A. One distinctive feature of the optical switching device 300 of FIG. 3 is that a CTE compensator, e.g. a compensating plate 304, may be mounted directly to the second portion 312B. The compensating plate 304 may have a CTE different from a CTE of the second portion 312B by at least 1 ppm/° C., and more preferably by at least 3 ppm/° C. In operation, the compensating plate 304 introduces a controllable amount of mechanical stress on the second portion 312B dependent on ambient temperature, to compensate for thermal stresses, thereby lessening center wavelength drift of the optical switching device 300. The size, shape and CTE of the compensating plate 304 may be selected accordingly, whereby the second portion 312B can be selected from a wider variety of materials and shapes, e.g. less expensive and/or better suited for other purposes.

The housing 110 may be hermetically sealed to ensure durability of the optical switching device 100. However, a standard lid sealing processes, e.g. resistance seam welding process, may cause a deformation of the base 112 due to residual sealing stresses. For this reason, a following low temperature sealing process may be preferable.

Figure 4:
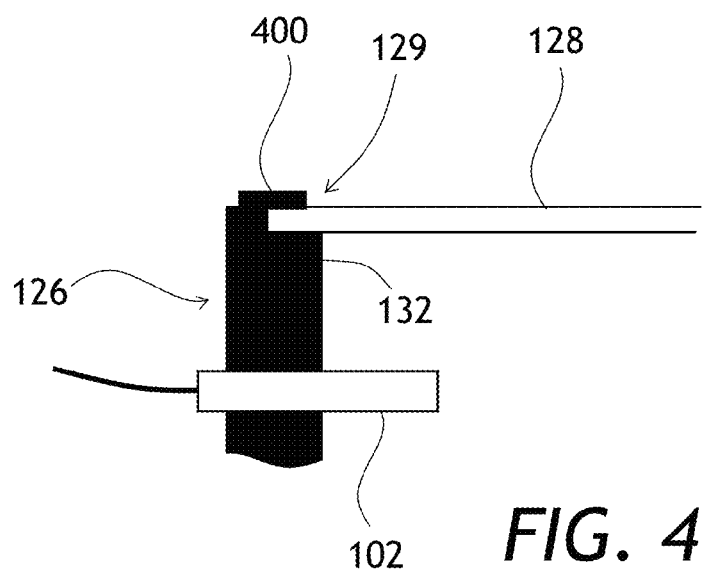
FIG. 4 illustrates a magnified side cross-sectional view of a lid mounted to a frame of a housing of the optical switching device of FIGS. 1A-1B, 2, or FIG. 3 using a seal ring.

Turning to FIG. 4 with further reference to FIGS. 1A, 1B, and FIG. 3, the cover 128 of the optical switch devices 100 and 300 may include a seal ring 400 (FIG. 4) mounted directly to the frame 126 and the lid 128 outside of the frame 126 along the perimeter 129 of the lid 128. The seal ring 400 allows the process of packaging the optical switch devices 100 and 300 to be conveniently performed in three stages. At the first stage, the frame 126 may be soldered to the bases 112 (FIG. 1A) and 312 (FIG. 3) using a solder having a melting temperature of no greater than 300° C., or alternatively brazed at approximately 800° C. At the second stage, the lid 128 may be affixed to the frame 126 e.g. by an epoxy, to protect the optics 106 from flux fumes during subsequent soldering. Using flux-assisted soldering broadens the possible selection of metallization materials for the lid 128; for instance, a simple Ni coating may be used for metallization of the lid 128. At the third stage, the seal ring 400 may be soldered to the frame 126 and the lid 128 e.g. using a low temperature solder such as 48 InSn melting at 118° C. The solder may have a melting temperature of less than 140° C. The frame 126 may have a recess 132 to accommodate the lid 128, or alternatively the seal ring 130 may be stepped, in which case the frame 126 may remain flat-edged.

For embodiments where the housing 110 is hermetically sealable (e.g. FIGS. 1A and 3), the optics 106 may become misaligned by deformation of the housing 110 caused by a pressure differential between the inside and outside of the housing 110. Although the deformation may be lessened by increasing the thickness of the base 112 (FIG. 1A), it may be preferable to control the pressure caused deformation by a proper construction of the lid 128.

Typically, the lid 128 is much more flexible than the frame 126 and the base 112A. As a result, deflection of the lid 128 due to atmospheric pressure differential is much greater (e.g. 100 times greater, or even more) than that of the base 112. The deflection may even become comparable to the lid 128 thickness, for the lid 128 thickness of about 1 mm or less. This may create substantial membrane forces in the deformed lid 128, like a string under tension. These membrane forces on the lid 128 may apply reaction forces and moments on the frame 126 of the housing 110, driving walls of the frame 126 inward, thereby contributing to deformation of the base 112.

Figure 5:
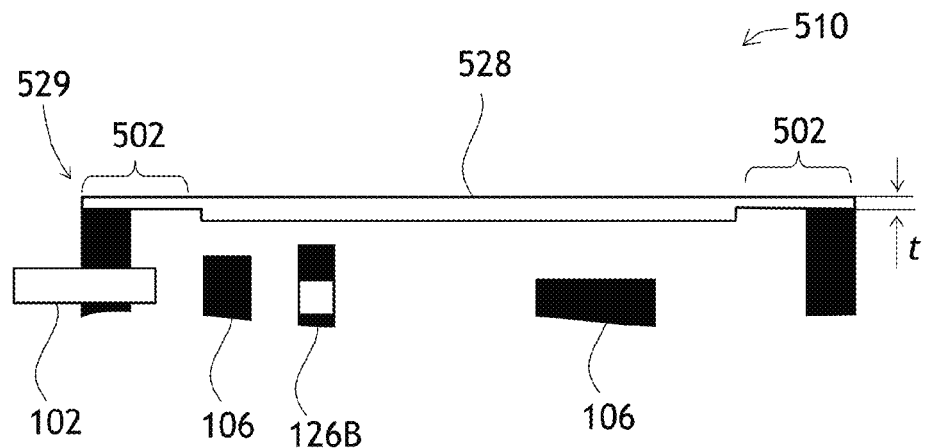
FIG. 5 illustrates a side cross-sectional view of a lid variant, which is thinned at the edges for reduction of pressure-induced base deformation of the optical switching device of FIGS. 1A-1B and FIG. 3.

Referring to FIG. 5, a lid 528 may be provided to lessen pressure-induced deformation of a housing 510. The lid 528 may include a tapered portion, or thinner constant-thickness edge portion 502 around a perimeter 529 of the lid 528, for lessening a deformation of the base, not shown, caused by atmospheric pressure differential between inside and outside of the housing 510. In one embodiment, a thickness t of the tapered or thinner constant-thickness edge portion 502 is no greater than 0.5 mm. Also in one embodiment, a geometrical area of the tapered or thinner constant-thickness edge portion 502 is no greater than 25% of a total geometrical area of the lid 528. It has been verified by a direct experiment that the base deformation is indeed lessened by using the lid 528 instead of the lid 128 (FIGS. 1A, 1B, and FIG. 3). One possible mechanism of the deformation reduction is that the membrane forces from the tapered or thinner constant-thickness edge portion 502 apply a compensating moment of force on the frame 126 walls, thereby reducing the cave-in of the frame 126 walls, which in turn results in lessening of the base deflection (the base is not shown in FIG. 4). The lid 528 may result in less than one micrometer deformation at the base thickness of approximately 3 mm.

Figure 6A:
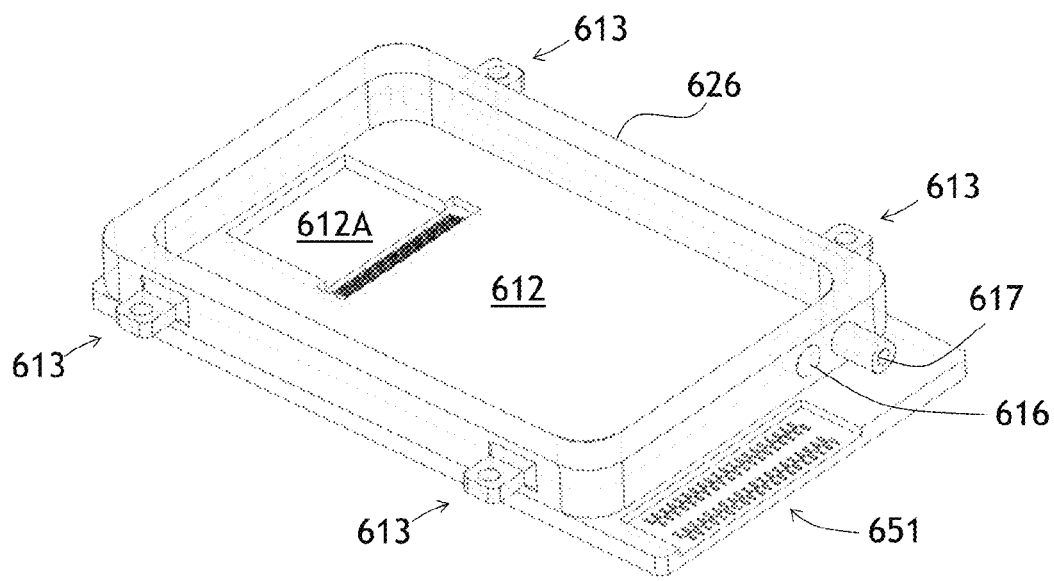
FIGS. 6A to 6C illustrate three-dimensional views of an optical switching device of the present disclosure at progressive stages of assembly.
Figure 6B:
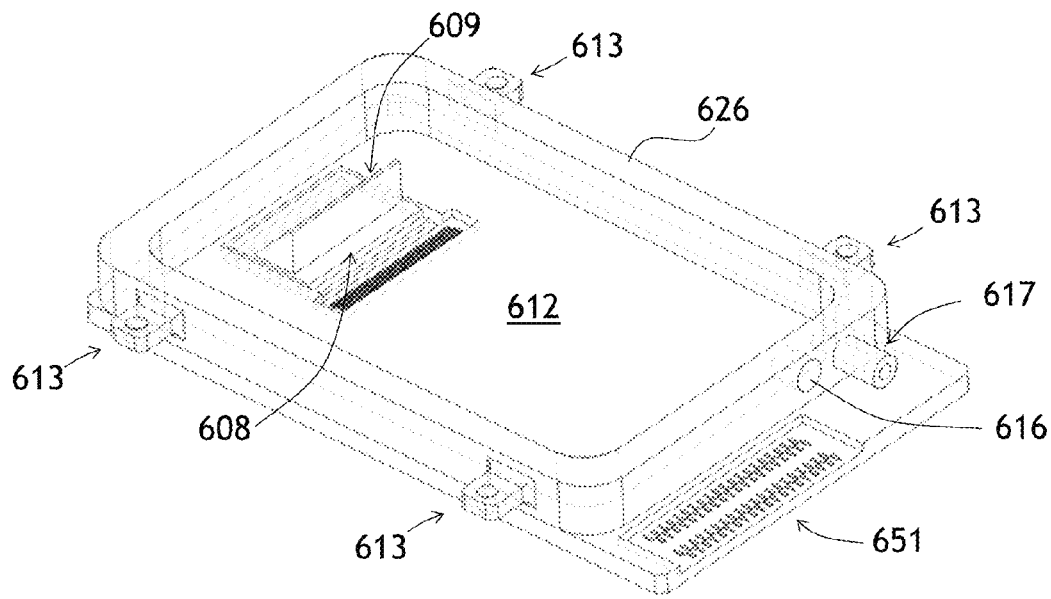

Referring to FIGS. 6A, 6B, 6C, and 6D, an assembly procedure of an optical switching device 600 (FIG. 6D) according to the present disclosure is illustrated. Referring specifically to FIG. 6A, a frame 626 may be mounted on an alumina ceramic base 612, which may include a sunk portion 612A and a connector mounting area 651. The frame 626 may include mounting flanges 613, a pressure-equalizing opening 616, and a tube 617 for feeding through input and output optical fibers, not shown. In FIG. 6B, an optical switching engine 608 may be mounted on the sunk portion 612A, and a folding mirror 609 may be mounted to the optical switching engine 608 for directing light onto the optical switching engine 608.

Figure 6C:
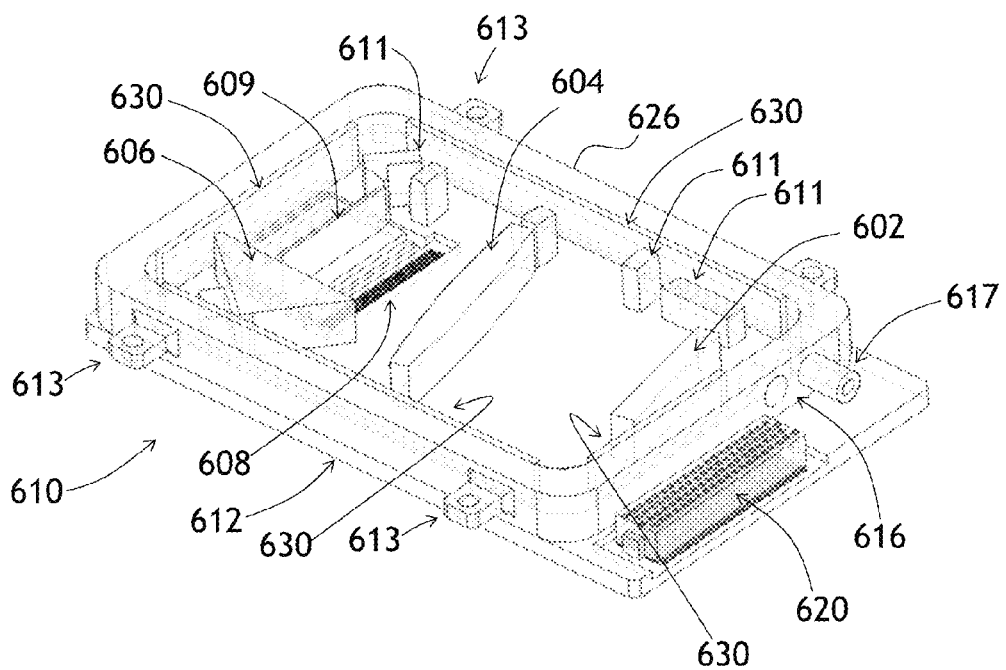

Turning to FIG. 6C, four heat spreader plates 630 may be attached to four inner walls of the Kovar frame 626. The number of the heat spreader plates 630 may of course vary. The heat spreader plates may have a thermal conductivity of at least 120 W/m·K. A diffraction grating 602, a lens 604, a compensating prism 606, and polarizing/redirecting/collimating optics 611 are aligned and mounted to the ceramic base 612. The base 612 and frame 626 materials may vary. A connector 620 may be mounted on the connector mounting area 651.

Figure 6D:
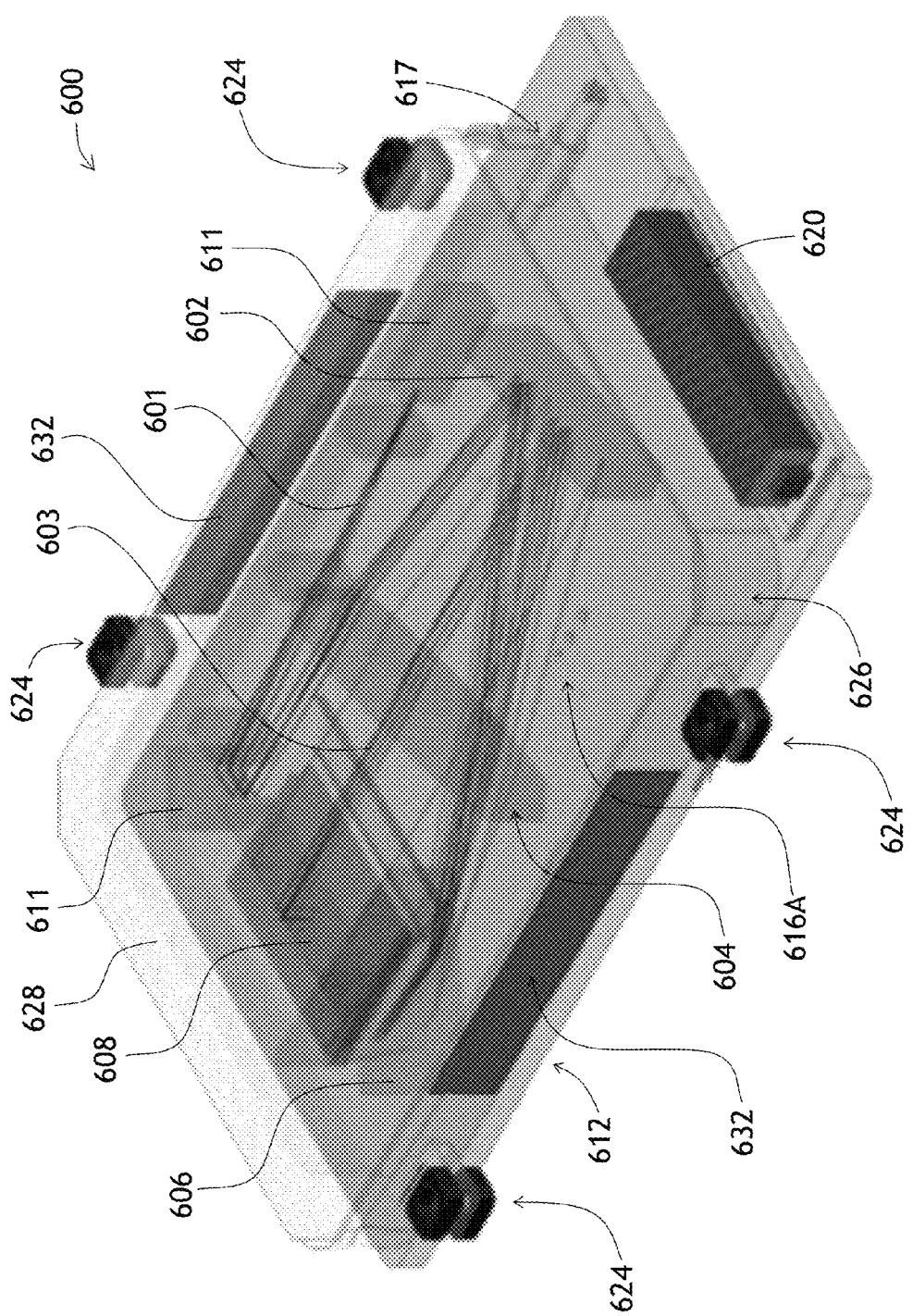
FIG. 6D illustrates a three-dimensional view of an assembled optical switching device.

Referring specifically to FIG. 6D, a three-dimensional view of the assembled optical switching device 600 illustrates a propagating input optical beam 601 split into individual wavelength sub-beams 603 by the diffraction grating 602 or other suitable means. A lid 628 is shown semi-transparent for convenience of viewing. The lid 628 may be mounted to the frame 626 using one of the lid mounting methods described above. Alternative pressure-equalizing openings 616A are provided in the lid 628. A pair of external heaters 632 may be thermally coupled to the frame 626, for maintaining the housing 610 at a substantially constant temperature. At least one heater 632 may be provided, but two heaters 632 may allow a better heat distribution. Elastomer grommets 624 may be used for flexible mounting the optical switching device 600 to an external chassis, not shown. The materials of the base 612, the frame 626, the lid 628, etc., may be varied. Thermally conductive materials having thermal conductivity of at least 30 W/m·K, which can be CTE matched to the optical switching engine 608, the diffraction grating 602, the lens 604, the compensating prism 606, the polarizing/redirecting/collimating optics 611, etc., are preferred.

The present disclosure is not to be limited in scope by the specific embodiments described herein. Indeed, other various embodiments and modifications, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An optical switching device comprising:
   at least one input port for inputting an optical signal comprising a plurality of wavelength channels;
   at least one output port for outputting at least one of the wavelength channels;
   optics for dispersing and redirecting the wavelength channels between the input and output ports;
   a switching engine optically coupled with the optics for redirecting at least one of the wavelength channels towards a selected output port; and
   a housing comprising:
      a base comprising a first portion comprised of ceramic CTE matched to the switching engine to within 4 ppm/° C., wherein the switching engine is mounted directly to the ceramic first portion; and
      a cover, the cover and the base enclosing and sealing the optics and the switching engine, wherein the cover is mounted directly to the base for stiffening the base;
   wherein the optics are CTE matched to the base to within 4 ppm/° C. and mounted directly to the base.

2. The optical switching device of claim 1, wherein the base further comprises a second portion extending from the ceramic first portion and comprised of metal CTE matched to the ceramic within 4 ppm/° C. for supporting at least some of the optics.

3. The optical switching device of claim 1, wherein the ceramic first portion comprises an HTCC assembly.

4. The optical switching device of claim 1, wherein the ceramic first portion includes an extension extending beyond the cover, and wherein the extension comprises electrical leads electrically connected to the switching engine and extending beyond the cover.

5. The optical switching device of claim 1, wherein the housing is mounted to an external chassis via mounts having modulus of elasticity of no greater than 20 MPa.

6. The optical switching device of claim 1, wherein the cover comprises a frame for mounting directly to the base and a lid having a perimeter and mounted to the frame along the perimeter.

7. The optical switching device of claim 6, wherein the frame comprises an inner section disposed between the optics and the switching engine and mounted directly to the base, for further stiffening the base, and an outer section surrounding the inner section, the optics, and the switching engine.

8. The optical switching device of claim 7, wherein the base further comprises a second portion extending from the ceramic first portion and comprised of metal CTE matched to the ceramic within 4 ppm/° C. for supporting at least some of the optics, wherein the second portion comprises the inner section of the frame.

9. The optical switching device of claim 1, wherein the cover comprises an opening for equating ambient air pressure and inside air pressure.

10. The optical switching device of claim 9, wherein the optical switching device further comprises a pressure sensor for sensing the ambient air pressure for lessening a wavelength drift of the optical switching device.

11. The optical switching device of claim 1, wherein the switching engine comprises an LCoS array.

12. The optical switching device of claim 1, wherein the base further comprises a second portion extending from the ceramic first portion, and wherein the housing further comprises a compensating plate mounted directly to the second portion and having a CTE different from a CTE of the second portion by at least 1 ppm/° C., for introducing thermally dependent deformations for lessening a wavelength drift of the optical switching device with temperature.

13. The optical switching device of claim 6, wherein the cover further comprises a seal ring mounted directly to the frame and the lid outside of the frame along the perimeter of the lid.

14. The optical switching device of claim 13, wherein the frame is soldered to the base using a solder having a melting temperature of less than 300° C., and wherein the seal ring is soldered to the frame and the lid using a solder having a melting temperature of less than 140° C.

15. The optical switching device of claim 6, wherein the housing comprises a hermetic housing, and wherein the lid comprises a thinner portion around the perimeter thereof, for lessening a deformation of the base caused by a pressure differential between inside and outside the housing.

16. The optical switching device of claim 15, wherein a thickness of the thinner portion is no greater than 0.5 mm, and wherein a geometrical area of the thinner portion is no greater than 25% of a total geometrical area of the lid.

17. The optical switching device of claim 1, wherein the base is comprised entirely of a ceramic material.

18. The optical switching device of claim 1, further comprising a heater thermally coupled to the housing, for maintaining the housing at a substantially constant temperature.

19. The optical switching device of claim 18, wherein the cover comprises a heat spreader having a thermal conductivity of at least 120 W/m·K.

20. The optical switching device of claim 1, wherein the optics comprise a diffraction grating, and wherein the switching engine comprises an LCoS array, a MEMS array, or a diffractive beamsplitter.

* * * * *